(12) United States Patent
Liao et al.

(10) Patent No.: US 8,422,336 B2
(45) Date of Patent: Apr. 16, 2013

(54) OPERATING METHOD FOR AN ULTRA-SOUND SENSOR

(75) Inventors: Yuan-Hung Liao, Hsinchu (TW); Chao-Wen Hu, Hsinchu (TW); Tzu-Nan Chen, Hsinchu (TW)

(73) Assignee: Lite-On It Corporation, Hsinchu (TW)

( * ) Notice: Subject to any disclaimer, the term of this patent is extended or adjusted under 35 U.S.C. 154(b) by 481 days.

(21) Appl. No.: 12/755,869

(22) Filed: Apr. 7, 2010

(65) Prior Publication Data

US 2011/0122728 A1    May 26, 2011

(30) Foreign Application Priority Data

Nov. 25, 2009   (CN) .......................... 2009 1 0225607

(51) Int. Cl.
*G01S 15/00*   (2006.01)

(52) U.S. Cl.
USPC ........................................................... 367/97

(58) Field of Classification Search .................... 367/13, 367/97
See application file for complete search history.

(56) References Cited

U.S. PATENT DOCUMENTS

2010/0067324 A1* 3/2010 Preissler ......................... 367/13
2011/0122728 A1* 5/2011 Liao et al. ....................... 367/95

FOREIGN PATENT DOCUMENTS

WO    WO 2007051665 A1 *  5/2007

* cited by examiner

*Primary Examiner* — Daniel Pihulic
(74) *Attorney, Agent, or Firm* — Robin & Berdo, P.C.

(57) ABSTRACT

An operating method adapted in an ultra-sound sensor is provided. The method includes the steps of emitting an ultra-sound wave, receiving a crosstalk signal within a crosstalk measuring window, determining whether the crosstalk signal is larger than a crosstalk threshold and triggering a crosstalk application if the crosstalk signal is smaller than the crosstalk threshold.

12 Claims, 5 Drawing Sheets

OPERATING METHOD FOR AN ULTRA-SOUND SENSOR

This application claims the benefit of People's Republic of China application Serial No. 200910225607.9, filed Nov. 25, 2009, the subject matter of which is incorporated herein by reference.

TECHNICAL FIELD

The invention relates in general to an operating method for an ultra-sound sensor.

BACKGROUND

The ultra-sound sensor measures physical parameters such as location, speed and distance by emitting and receiving an ultra-sound wave. In an ordinary electronic device using an ultra-sound sensor, a micro-processor generates a driving voltage/current signal according to the frequency and magnitude of the to-be-emitted ultra-sound wave for driving the ultra-sound emitter to emit an ultra-sound wave. Then, the ultra-sound receiver receives the reflected ultra-sound wave and the micro-processor further converts the received ultra-sound wave into a voltage/current signal. Normally, the ultra-sound sensor has both functions of receiving and emitting ultra-sound waves.

In the application of ultra-sound sensor, two or more ultra-sound sensors can be used in detection. When two or more ultra-sound sensors are used, normally, one ultra-sound sensor is used for emitting an ultra-sound wave and another ultra-sound sensor is used for receiving a reflected ultra-sound wave. However, as the radiation sound fields and the distances between the ultra-sound sensors are too close, the ultra-sound receiver may receive not only the reflected ultra-sound wave but also the ultra-sound wave directly transmitted from the emitter on the lateral side, hence resulting in crosstalking. Thus, the ultra-sound receiver may mistake the crosstalk signal as a reflected ultra-sound wave and may lead to erroneous judgment or control. For example, in distance measurement, the crosstalk signal may make the distance-measurement function abnormal or erroneous judgment. Therefore, in general, a special controlling method is used to avoid or exclude the occurrence of crosstalk.

However, crosstalk does not result negative effect only. Crosstalk may be applied in control to provide more control functions without changing hardware architecture.

BRIEF SUMMARY

One example of the invention is directed to an operating method for an ultra-sound sensor, which triggers a crosstalk application if a crosstalk signal is smaller than a threshold.

According to an exemplary embodiment of the present invention, an operating method adapted in an ultra-sound sensor is provided. The method includes the steps of emitting an ultra-sound wave, receiving a crosstalk signal within a crosstalk measuring window, determining whether the crosstalk signal is larger than a crosstalk threshold and triggering a crosstalk application if the crosstalk signal is smaller than the crosstalk threshold.

According to another exemplary embodiment of the present invention, an operating method adapted in an ultra-sound sensor is provided. The method includes the steps of emitting an ultra-sound wave, receiving a crosstalk signal and shielding a crosstalk signal path to trigger a crosstalk application.

It is to be understood that both the foregoing general description and the following detailed description are exemplary and explanatory only and are not restrictive of the disclosed embodiments, as claimed.

DETAILED DESCRIPTION OF EXEMPLARY EMBODIMENT OF THE INVENTION

In an embodiment of the invention, under suitable circumstances, crosstalk can be used for function switch. That is, function switch may be performed based on detection of crosstalk. Therefore, there is no need to eliminate crosstalk. Furthermore, through suitable logic judgment, crosstalk can be used to perform more control functions. In an embodiment of the invention, no extra hardware architecture is needed and further some hardware elements can even be saved.

For convenience of elaboration, two ultra-sound sensors are used as an exemplification in the present embodiment of the invention. However, the invention is not limited thereto. That is, the application of multiple ultra-sound sensors can also be used in other embodiments of the invention.

Figure 1:
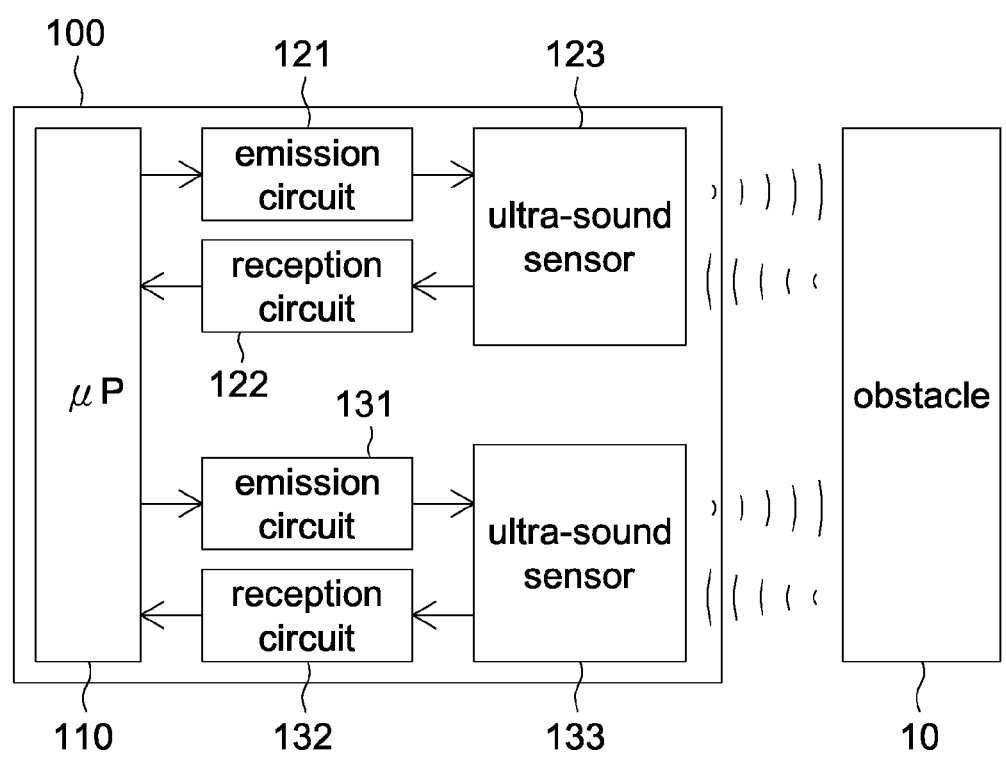
FIG. 1 shows a functional diagram of an electronic device according to an embodiment of the invention.

FIG. 1 shows a functional diagram of an electronic device according to an embodiment of the invention. As indicated in FIG. 1, the electronic device 100 includes a micro-processor (μP) 110, two emission circuits 121 and 131, two reception circuits 122 and 132, and two ultra-sound sensors 123 and 133. The micro-processor 110 emits a driving signal to the emission circuits 121 and 131. The emission circuits 121 and 131 respectively drive the ultra-sound sensors 123 and 133 to emit ultra-sound waves according to the driving signal. When the ultra-sound wave reflects from an obstacle 10 (such as the hand or the wall), a reflective ultra-sound wave is received by the ultra-sound sensors 123 and 133. The reception circuits 131 and 132 convert the reflective ultra-sound wave into a voltage/current signal and further transmit the voltage/current signal to the micro-processor 110.

In the present embodiment of the invention, the ultra-sound sensors 123 and 133 can be an open type or a close type. However, both types are subjected to the crosstalk. Besides, in some cases, one of the ultra-sound sensors 123 and 133 is used for emitting an ultra-sound wave and the other for receiving an ultra-sound wave; and in other cases, both the ultra-sound sensors 123 and 133 are used for emitting and receiving the ultra-sound waves.

Figure 2A:
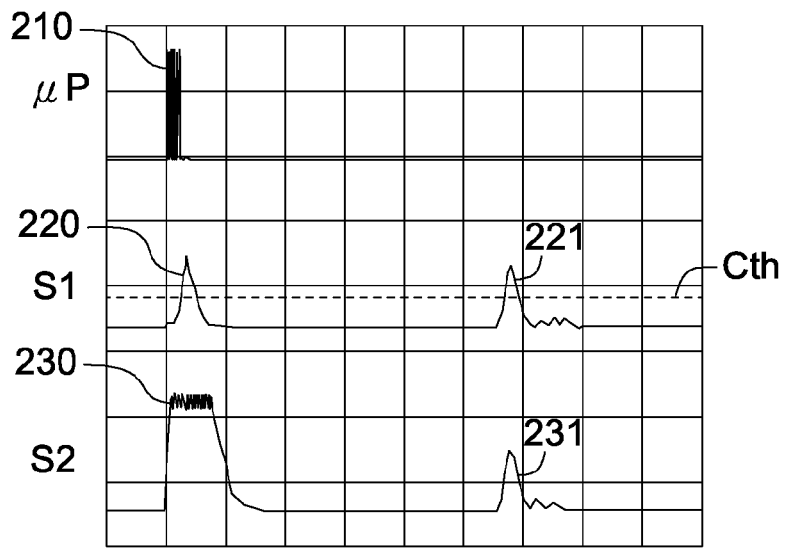
FIG. 2A shows a timing diagram according to the embodiment of the invention, wherein the ultra-sound emitter is not shielded.
Figure 2B:
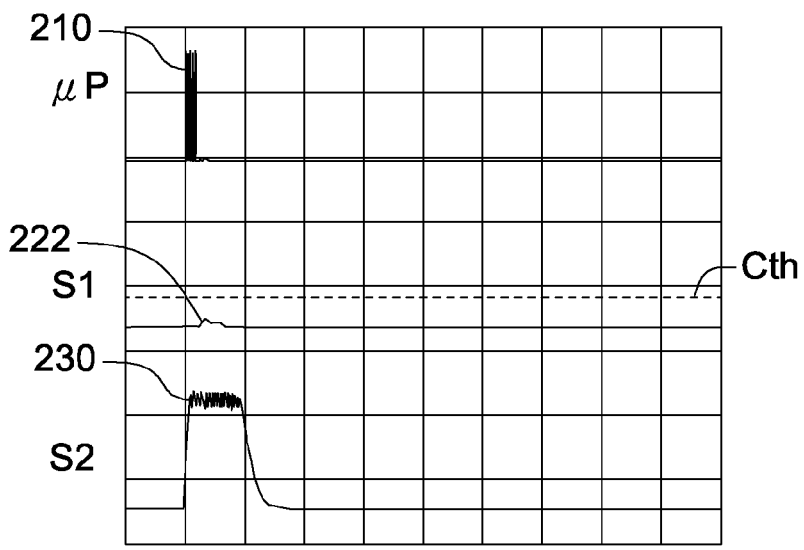
FIG. 2B shows a timing diagram according to the embodiment of the invention, wherein the ultra-sound emitter is shielded.

FIG. 2A shows a timing diagram according to the embodiment of the invention, wherein the ultra-sound emitter is not shielded. FIG. 2B shows a timing diagram according to the embodiment of the invention, wherein the ultra-sound sensor emitter is shielded. In FIG. 2A and FIG. 2B, µP denotes the voltage pulse signal (also, referred as driving voltage) emitted by the micro-processor; S1 denotes ultra-sound waves received/emitted by one of the ultra-sound sensors 123 and 133; S2 denotes ultra-sound waves received/emitted by the other of the ultra-sound sensors 123 and 133.

Presumable, the micro-processor emits a driving voltage to the ultra-sound sensor 123 (that is, S1 denotes the ultra-sound waves received by the ultra-sound sensor 133; S2 denotes the ultra-sound waves received/emitted by the ultra-sound sensor 123). However, the invention is not limited thereto. That is, the micro-processor may also emit a driving voltage to the ultra-sound sensor 133.

As indicated in FIG. 2A, the micro-processor emits a driving voltage 210 to the ultra-sound sensor 123 (S2) and the ultra-sound sensor 123 (S2) emits an ultra-sound signal 230. Due to the crosstalk, the ultra-sound sensor 133 (S1) receives a crosstalk signal 220. That is, the ultra-sound signal 230 is directly received by the ultra-sound sensor 133 as the crosstalk signals, direct transmission from the ultra-sound sensor 123 without reflection. Moreover, the magnitude of the crosstalk signal 220 exceeds a crosstalk threshold Cth. In FIG. 2A, after reflection from an obstacle, the ultra-sound signal 230 is reflected as the reflected ultra-sound waves 221 and 231, which are respectively received by the ultra-sound sensors 133 and 123.

If an object shields the ultra-sound emitter or gets very close to the ultra-sound emitter, the crosstalk signal will be weakened significantly. As indicated in FIG. 2B, as the ultra-sound emitting sensor 123 is shielded, the ultra-sound signal 230 cannot be emitted out. Thus, the crosstalk signal 222 received by the ultra-sound sensor 133 (S1) drops to be smaller than the crosstalk threshold Cth.

Figure 2C:
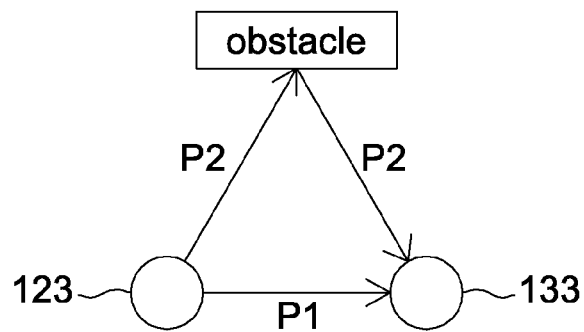
FIG. 2C shows paths for crosstalk signal and reflected sound waves, respectively.

FIG. 2C shows a crosstalk path P1 and a reflected ultra-sound wave path P2. Thus, the crosstalk path P1 is directly transmitted to the received ultra-sound sensor from a lateral side without reflection. The reflected sound wave path P2 implies that, the emitted ultra-sound signal is reflected, from the obstacle, as the reflected ultra-sound wave.

Figure 3A:
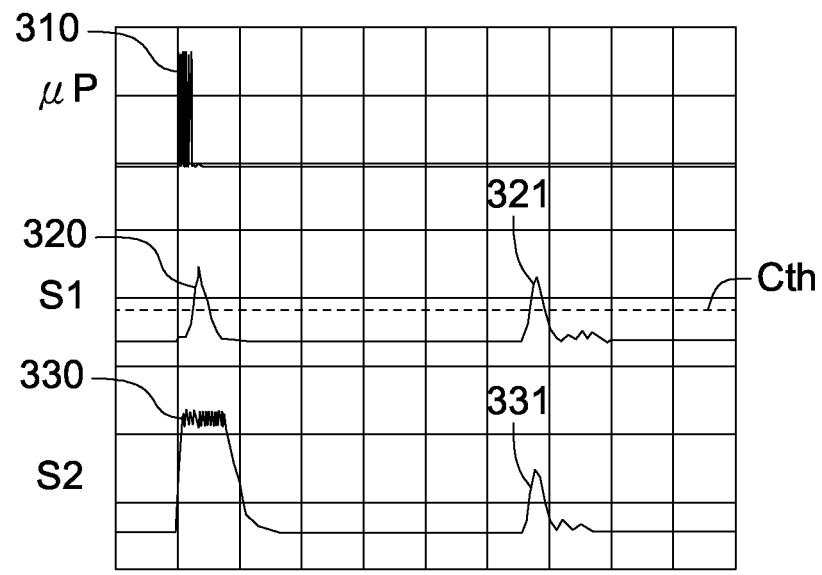
FIG. 3A shows a timing diagram according to the embodiment of the invention, wherein the ultra-sound receiver is not shielded.
Figure 3B:
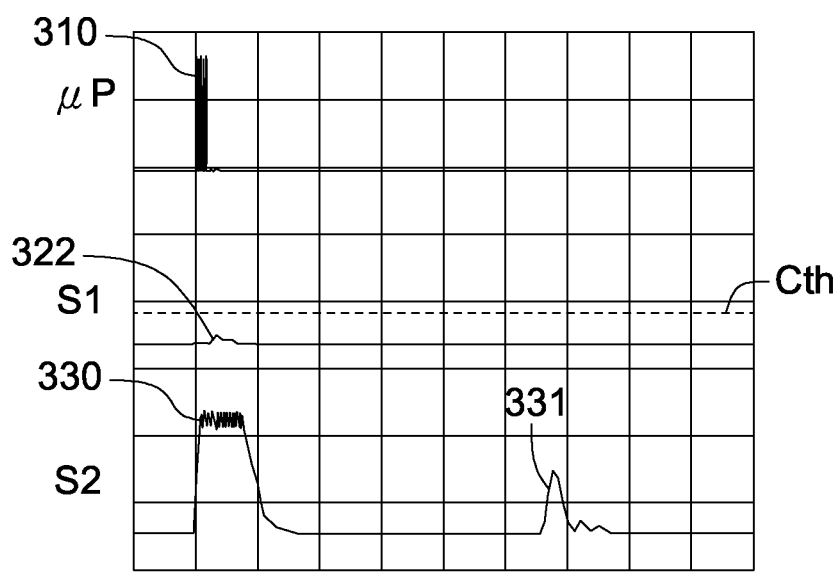
FIG. 3B shows a timing diagram according to the embodiment of the invention, wherein the ultra-sound receiver is shielded.

FIG. 3A shows a timing diagram according to the embodiment of the invention, wherein the ultra-sound receiver is not shielded. FIG. 3B shows a timing diagram according to the embodiment of the invention, wherein the ultra-sound receiver is shielded.

As indicated in FIG. 3A, the micro-processor emits a driving voltage 310 to the ultra-sound sensor 123 (S2) and the ultra-sound sensor 123 (S2) emits an ultra-sound signal 330. Due to the crosstalk, the ultra-sound sensor 133 (S1) receives a crosstalk signal 320. That is, the ultra-sound signal 330 is directly transmitted to the ultra-sound sensor 133 from the ultra-sound sensor 123, without reflection. Moreover, the magnitude of the crosstalk signal 320 exceeds a crosstalk threshold Cth. In FIG. 3A, the ultra-sound signal 330 is reflected by an obstacle as the reflected ultra-sound waves 321 and 331, which are respectively received by the ultra-sound sensors 133 and 123.

If an object shields the ultra-sound receiver or gets very close to the ultra-sound receiver, the crosstalk signal is weakened significantly. As indicated in FIG. 3B, the ultra-sound receiving sensor 133 is shielded, so the crosstalk signal 322 received by the ultra-sound sensor 133 (S1) drops to be smaller than crosstalk threshold Cth. As the ultra-sound receiving sensor 133 is shielded, the ultra-sound sensor 133 cannot receive any reflected ultra-sound wave.

The crosstalk can be applied in various electronic devices for controlling the function switch. In the present embodiment of the invention, the ultra-sound sensing device may be applied in the control of a lighting device as an exemplification of the invention. However, the invention is not limited to the application in the control of the lighting device, and can also be applied in the control of various electronic devices.

Figure 4:
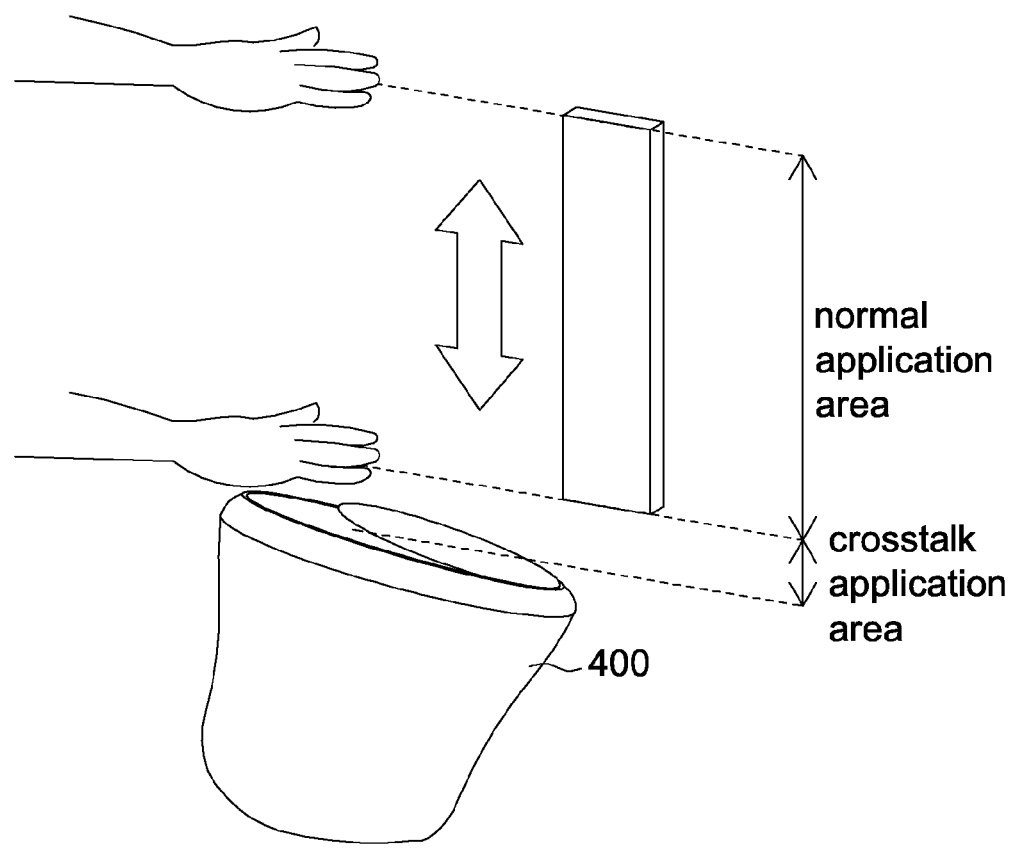
FIG. 4 shows normal and the crosstalk application areas in a lighting device.

Referring to FIG. 4, a normal application area and a crosstalk application area in a lighting device are shown. In FIG. 4, "normal application area" denotes the normal control of the lighting device 400. In the normal application area, the micro-processor can distinguish the reflected ultra-sound wave reflected from an obstacle (such as a hand). That is, the distance between the obstacle and the ultra-sound sensor can be normally measured and the lighting device can be controlled according to the measured distance, such as change or adjust the color or brightness of the lamp. "Crosstalk application area" denotes the crosstalk application of the lighting device 400. In the crosstalk application area, when the hand touches or gets very close to the ultra-sound sensor, the crosstalk signal received by the ultra-sound sensor is lower than the threshold. Moreover, in the crosstalk application area, due to the crosstalk, the distance between the obstacle and the ultra-sound sensor can be hardly normally detected.

Figure 5:
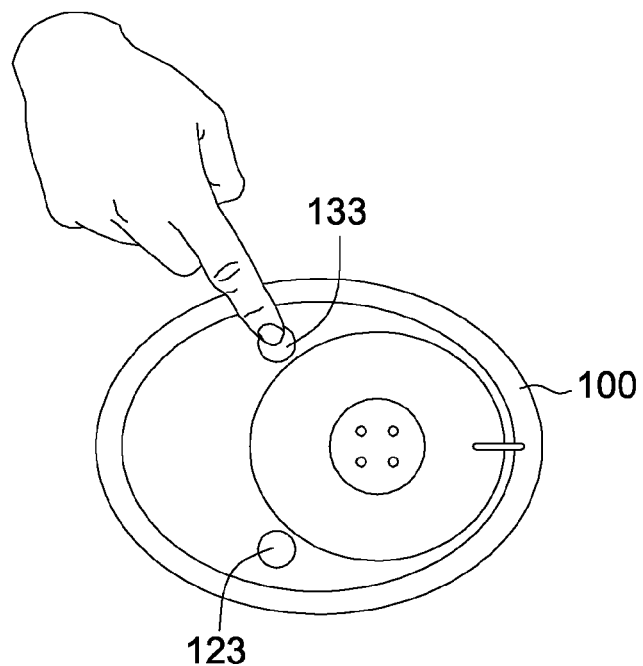
FIG. 5 shows ON/OFF control of the electronic device when a user's hand touch or get very close to the ultra-sound sensors of the electronic device according to the embodiment of the invention.

The abovementioned crosstalk can be applied in the switch control of an electronic device such as a lighting device. The switch control can be used in ON/OFF control of the electronic product or used in controlling ON/OFF of a particular function of the electronic product. For any function of the electronic device, if the function is switched between two stages, the controlling method of the embodiment of the invention can be adopted. The controlling method of the invention is not limited to the application of the ON/OFF function. FIG. 5 shows ON/OFF control of the electronic device when a user's hand touch or get very close to the ultra-sound sensors of the electronic device according to the embodiment of the invention.

Figure 6:
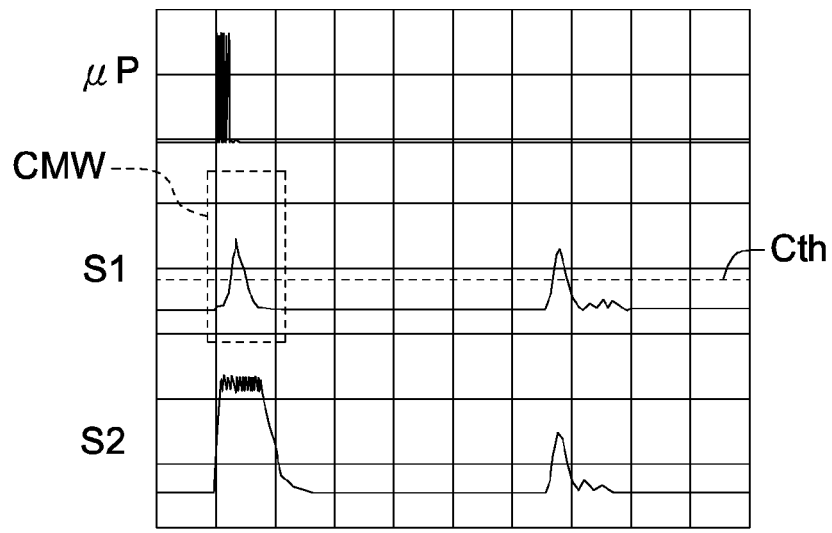
FIG. 6 shows a crosstalk measuring window (CMW)

For convenience of elaboration, the interval in which the crosstalk signal may occur is referred as a crosstalk measuring window (CMW) herebelow as indicated in FIG. 6. In principle, the crosstalk measuring window may be overlapped with ultra-sound emission period.

Figure 7:
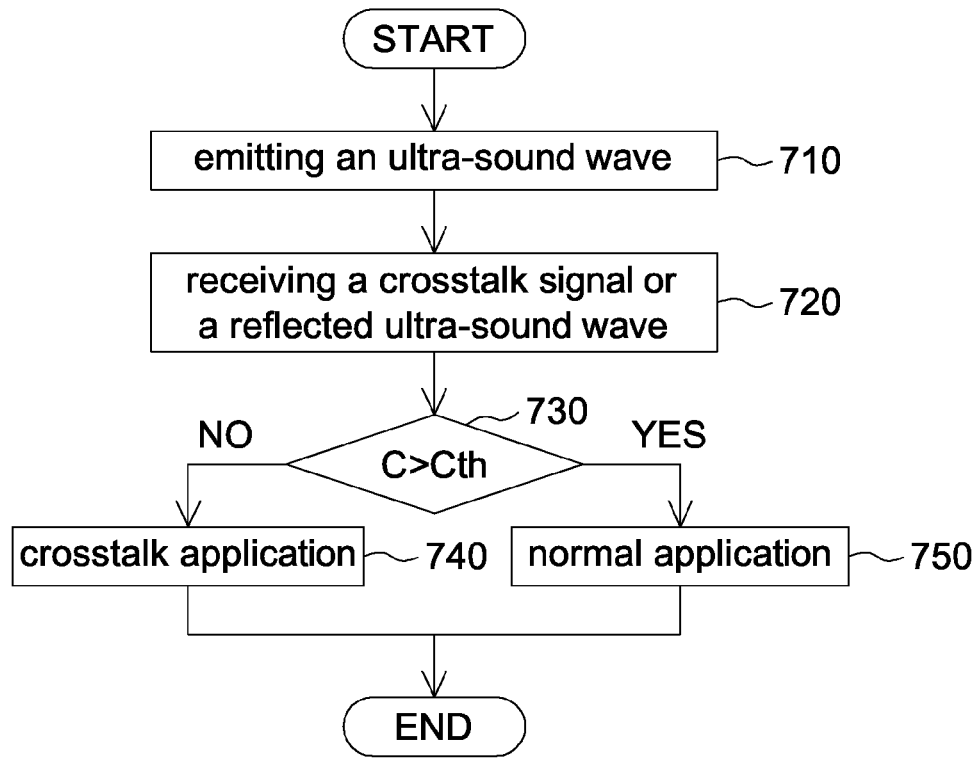
FIG. 7 shows a flowchart of an operating method according to the present embodiment of the invention.

Referring to FIG. 7, a flowchart of an operating method according to the present embodiment of the invention is shown. In FIG. 7, at step 710, an ultra-sound wave is emitted. In step 720, a crosstalk signal or a reflected ultra-sound wave is received. In step 730, it is determined whether the crosstalk signal C received within a crosstalk measuring window is larger than a crosstalk threshold Cth or not. If so, this implies that the ultra-sound sensor is not shielded, so the micro-processor determines that the user would like to perform a normal application as indicated in step 750. To the contrary, if the crosstalk signal C received within the crosstalk measuring window is smaller than the crosstalk threshold Cth, this implies that the ultra-sound sensor is shielded by the user, so the micro-processor determines that the user would like to perform a crosstalk application as indicated in step 740.

In the present embodiment of the invention, more than two ultra-sound sensors are used. Each ultra-sound sensor has at least one of an ultra-sound emission function and an ultra-sound reception function. If the distance between the ultra-sound sensors is fixed, the ultra-sound receiver may receive the crosstalk signal. When the sensor is shielded or touched by an object or a hand (that is, the crosstalk signal path is shielded), the crosstalk signal is smaller than the threshold no matter the ultra-sound emitter or the ultra-sound receiver is shielded or touched. So, the crosstalk application is triggered and further used in two-stage control.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. An operating method adapted in an ultra-sound sensor, comprising:
   emitting an ultra-sound wave by a first ultra-sound sensor;
   receiving a crosstalk signal within a crosstalk measuring window;
   determining whether the crosstalk signal is larger than a crosstalk threshold;
   triggering a crosstalk application if the crosstalk signal is smaller than the crosstalk threshold; and
   determining that an obstacle shields or is close to the first ultra-sound sensor if the crosstalk signal received within the crosstalk measuring window is smaller than the crosstalk threshold.

2. The method according to claim 1, further comprising: triggering a normal application if the crosstalk signal is larger than the crosstalk threshold.

3. The method according to claim 1, wherein the crosstalk measuring window is overlapped with an ultra-sound emission period.

4. The method according to claim 1, wherein the step of receiving the crosstalk signal comprises: receiving the crosstalk signal or a reflected ultra-sound wave by a second ultra-sound sensor.

5. The method according to claim 4, further comprising: determining the obstacle shields or gets close to the second ultra-sound sensor if the crosstalk signal received within the crosstalk measuring window is smaller than the crosstalk threshold.

6. An operating method adapted in an ultra-sound sensor, the method comprises:
   emitting an ultra-sound wave;
   receiving a crosstalk signal; and
   shielding a crosstalk signal path to trigger a crosstalk application, including
      determining whether the crosstalk signal received within a crosstalk measuring window is larger than a crosstalk threshold, and
      determining that the crosstalk signal path is shielded if the crosstalk signal is smaller than the crosstalk threshold.

7. The method according to claim 6, further comprising: triggering a normal application by not shielding the crosstalk signal path.

8. The method according to claim 6, wherein the crosstalk measuring window is overlapped with an ultra-sound emission period.

9. The method according to claim 6, wherein the step of emitting the ultra-sound wave comprises: emitting the ultra-sound wave by a first ultra-sound sensor.

10. The method according to claim 9, wherein the step of receiving the crosstalk signal comprises: receiving the crosstalk signal or a reflected ultra-sound wave by a second ultra-sound sensor.

11. The method according to claim 9, wherein the step of shielding the crosstalk signal path further comprises: shielding or getting close to the first ultra-sound sensor by an obstacle.

12. The method according to claim 10, wherein the step of shielding the crosstalk signal path further comprises: shielding or getting close to the second ultra-sound sensor by an obstacle.

* * * * *

UNITED STATES PATENT AND TRADEMARK OFFICE
CERTIFICATE OF CORRECTION

PATENT NO. : 8,422,336 B2  
APPLICATION NO. : 12/755869  
DATED : April 16, 2013  
INVENTOR(S) : Yuan-Hung Liao It is certified that error appears in the above-identified patent and that said Letters Patent is hereby corrected as shown below:

On the Title Page, Item [74]

"Robin & Berdo, P.C." should be --Rabin & Berdo, P.C.--

Signed and Sealed this
Fourth Day of June, 2013

Teresa Stanek Rea
*Acting Director of the United States Patent and Trademark Office*